(12) United States Patent
Huang et al.

(10) Patent No.: US 9,793,174 B1
(45) Date of Patent: Oct. 17, 2017

(54) FINFET DEVICE ON SILICON-ON-INSULATOR AND METHOD OF FORMING THE SAME

(71) Applicant: UNITED MICROELECTRONICS CORP., Hsin-Chu (TW)

(72) Inventors: Ping-Wei Huang, Pingtung County (TW); Yu-Ren Wang, Tainan (TW); Keng-Jen Lin, Kaohsiung (TW); Shu-Ming Yeh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/270,000

(22) Filed: Sep. 20, 2016

(30) Foreign Application Priority Data

Aug. 5, 2016 (TW) .............................. 105124924 A

(51) Int. Cl.
| | |
|---|---|
| *H01L 27/12* | (2006.01) |
| *H01L 27/088* | (2006.01) |
| *H01L 21/84* | (2006.01) |
| *H01L 21/762* | (2006.01) |
| *H01L 29/78* | (2006.01) |

(52) U.S. Cl.
CPC ...... *H01L 21/845* (2013.01); *H01L 21/76224* (2013.01); *H01L 27/1211* (2013.01); *H01L 29/7851* (2013.01); *H01L 29/7853* (2013.01)

(58) Field of Classification Search
CPC ............... H01L 21/845; H01L 29/7851; H01L 29/7853
USPC ................................................... 257/347, 401
See application file for complete search history.

(56) References Cited

U.S. PATENT DOCUMENTS

| | | | |
|---|---|---|---|
| 9,093,275 B2 * | 7/2015 | Greene | ............ H01L 21/02636 |
| 9,166,023 B2 | 10/2015 | Loubet | |
| 9,385,023 B1 * | 7/2016 | Cheng | ................. H01L 29/7855 |
| 2015/0228722 A1 * | 8/2015 | Chung | ............... H01L 29/0657 |
| | | | 257/401 |
| 2015/0340381 A1 * | 11/2015 | Ramachandran | ... H01L 27/1211 |
| | | | 257/351 |
| 2016/0315084 A1 * | 10/2016 | Wu | ..................... H01L 27/0924 |
| 2016/0336428 A1 * | 11/2016 | Cheng | .............. H01L 29/66795 |

* cited by examiner

*Primary Examiner* — David Vu
*Assistant Examiner* — Brandon Fox
(74) *Attorney, Agent, or Firm* — Winston Hsu

(57) ABSTRACT

A fin field effect transistor (FinFET) on a silicon-on-insulator and method of forming the same are provided in the present invention. The FinFET includes first fin structure, second fin structure and an insulating layer. The first fin structure and the second fin structure are disposed on a substrate. The insulating layer covers the first fin structure and the second fin structure and exposes a first portion of the first fin structure and a second portion of the second fin structure. The first fin structure has a first height and the second fin structure has a second height different from the first height, and a top surface of the first fin structure and a top surface of the second fin structure are at different levels.

17 Claims, 5 Drawing Sheets

FINFET DEVICE ON SILICON-ON-INSULATOR AND METHOD OF FORMING THE SAME

BACKGROUND OF THE INVENTION

1. Field of the Invention

The present invention relates generally to a fin field effect transistor (FinFET) and a method of forming the same, and more particularly, to a FinFET on a silicon-on-insulator and a method forming the same.

2. Description of the Prior Art

With the trend in the industry being scaling down the size of the Metal Oxide Semiconductor field effect transistors (MOSFETs), the development of conventional planar type MOSFET has encountered the process limit. To overcome the process limitation, three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

One objective of the present invention is to provide a fin field effect transistor (FinFET), wherein the FinFET has fin structures with different heights and materials in individual areas to achieve a better device performance.

Another objective of the present invention is to provide a method of forming the FinFET. The method features the step of forming fin structures with different heights and materials in individual areas, thus the resulting FinFETs would have channel regions at different levels and with different materials to achieve a better device performance.

To achieve the aforesaid objective, a FinFET is provided in an embodiment of the present invention, which includes first fin structures, second fin structures and an insulating layer. The first fin structures and the second fin structures are disposed on a substrate. The insulating layer covers the first fin structures and the second fin structures and exposes the first portions of the first fin structures and the second portions of the second fin structures. The first fin structure has a first height and the second fin structure has a second height different from the first height, and a top surface of the first fin structure and a top surface of the second fin structure are at different levels.

To achieve the aforesaid objective, a method of forming the FinFET is provided in an embodiment of the present invention, which includes the steps of, first, providing a substrate having a first area and a second area, forming a plurality of fin structures in the first area and the second area, forming an insulating layer covering the fin structures in the first area and the second area, partially removing the insulating layer in the first area and forming a plurality of first fin structures with a first height, partially removing the fin structures and the insulating layer in the second area and forming a plurality of second fin structures with a second height, wherein the first height and the second height are different, and the top surface of the first fin structure and the top surface of the second fin structure are at different levels.

The FinFET device of the present invention is provided with fin structures with different heights and the insulating layer with different thicknesses in different areas, so that the insulating layer would cover lower portions and exposes upper portions of individual fin structures to form fins with the same height. In this way, the fin structures with different heights may be used to form channel regions in the FinFETs at different levels. The manufacturing method of the present invention may be applied to manufacture two or more FinFET structures with different conductive type in individual transistor areas to achieve a better device performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are cross-sectional views illustrating the steps of forming the fin field effect transistor (FinFET) in accordance with a first embodiment of the present invention, wherein:

FIG. 1 is a schematic cross-sectional view of a FinFET in the beginning of the method;

FIG. 2 is a schematic cross-sectional view of a FinFET after an insulating layer is formed;

FIG. 3 is a schematic cross-sectional view of a FinFET after the insulating layer in an area is partially removed;

FIG. 4 is a schematic cross-sectional view of a FinFET after the fin structures in an area are partially removed;

FIG. 5 is a schematic cross-sectional view of a FinFET after a patterned photoresist layer is formed;

FIG. 6 is a schematic cross-sectional view of a FinFET after the insulating layer in another area is partially removed; and FIG. 7 is a schematic cross-sectional view of a FinFET after a gate electrode is formed.

FIGS. 8-10 are cross-sectional views illustrating the steps of forming the FinFETs in accordance with a second embodiment of the present invention, wherein:

FIG. 8 is a schematic cross-sectional view of a FinFET after an insulating layer is formed;

FIG. 9 is a schematic cross-sectional view of a FinFET after the insulating layer and the fin structures in an area are partially removed; and FIG. 10 is a schematic cross-sectional view of a FinFET after the insulating layer in another area is partially removed.

DETAILED DESCRIPTION

To provide a better understanding of the present invention to those of ordinarily skilled in the art, several exemplary embodiments will be detailed as follows, with reference to the accompanying drawings with numbered elements to elaborate the contents and effects to be achieved.

Figure 1:
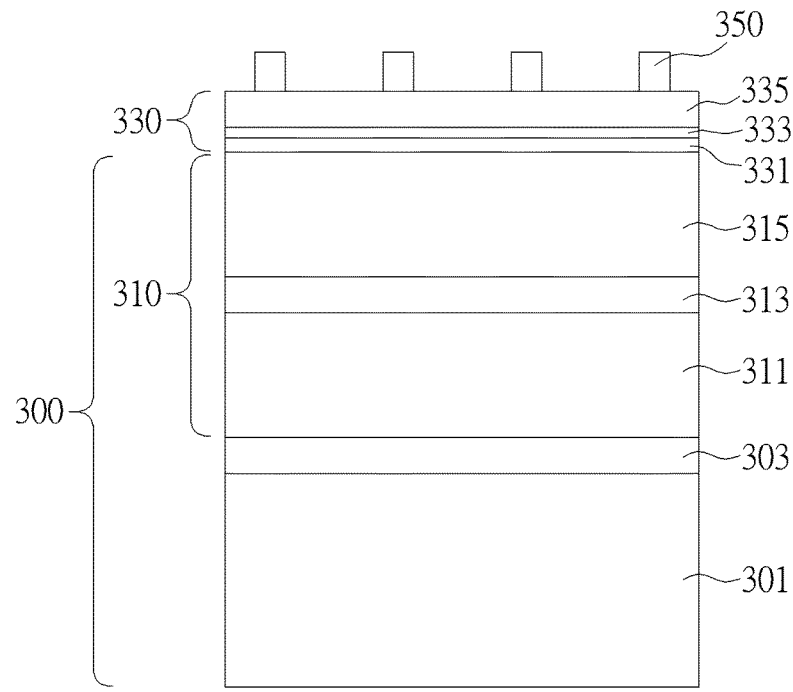

Please refer to FIGS. 1-7, which are schematic cross-sectional views illustrating the steps of forming fin field effect transistor (FinFET) in accordance with a first embodiment of the present invention. First, a semiconductor substrate 301 (ex. a silicon substrate or an epitaxial silicon substrate) is provided, and a dielectric layer (ex. a bottom oxide layer 303) and a single crystal stack layer 310 are formed sequentially on the semiconductor substrate 301, so that the semiconductor substrate 301, the bottom oxide layer 303 and the single crystal stack layer 310 constitute a silicon-on-isolator (SOI) substrate 300 as shown in FIG. 1. In this embodiment, the single crystal stack layer 310 may include a first single crystal layer 311 and a second crystal layer 315 sequentially stacked. Preferably, the first single crystal layer 311 and the second crystal layer 315 have different semiconductor materials. For example, the first single crystal layer 311 may optionally include an epitaxial silicon layer, and the second single crystal layer 315 may optionally include an epitaxial silicon-germanium (SiGe) layer, but not limited thereto. In another embodiment, the first single crystal layer 311 and the second single crystal layer 315 may have the epitaxial layer with the same material, or may have epitaxial layers with elements in group III or group V elements respectively. For example, the first single crystal layer 311 includes epitaxial silicon carbide (SiC) or silicon phosphide (SiP) and the second single crystal layer 315 includes epitaxial germanium, but not limited thereto. In addition, it should be understand that, in other embodiment, the single crystal stack layer may include two or more single crystal layers depending on the device requirement, rather than being limited to aforementioned only two single crystal layers.

Specifically, the process of the single crystal stack layer 310 may, for example, include the steps of first performing a wafer bonding process to seal the first single crystal layer 311 correspondingly onto the bottom oxide layer 303. The selective epitaxial growth process is then performed to form the second single crystal layer 315 on the first single crystal layer 311. Please note that a separation region 313 may be further provided between the first single crystal layer 311 and the second single crystal layer 315 to prevent current leakage. The separation region 313 is used as an anti-punch-through doped region. It may be formed, for example, by performing an in-situ doping process to dope the dopants with opposite conductive type during the selective epitaxial growth process. Alternatively, the separation region 313 may be a region doped with heterogenous atoms (ex. Ge atoms) in lower concentration. It may be formed, for example, by forming a concentration gradient of the heterogenous atoms during the selective epitaxial growth process. In another embodiment, the separation region may be an insulating layer formed by a second SOI process, for example.

Subsequently, a plurality of fin structures 310a, 310b are formed by, for example, the process including the steps of first forming a mask layer 330 and a patterned mask layer 350 on SOI substrate 300. The pattern of the patterned mask layer 350 are then transferred to the underlying mask layer 330 and the single crystal stack layer 310 to form a plurality of trenches (not shown) and fin structures 310a. The patterned masked layer 350 is then completely removed. The mask layer 330 may be a single-layer or multi-layer structure. For example, it may be constituted by a first mask layer 331 (ex. a silicon oxide layer), a second mask layer 333 (ex. a silicon nitride layer) and a third mask layer 335 (ex. a silicon oxide layer) as shown in FIG. 1.

Figure 2:
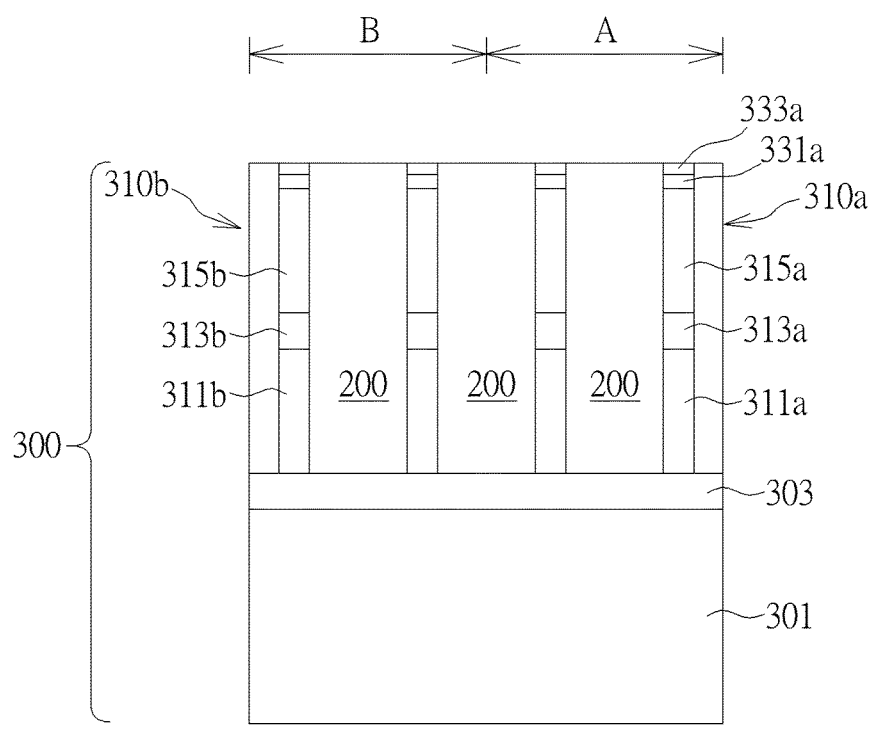

It should be noted that, in the present invention, a spacer self-aligned double-patterning (SADP) method may be performed to form patterned mask layer 350 in advance in order to obtain smaller dimension and pitch as shown in FIG. 1. In this way, the fin structure 310a, 310b with smaller dimension and pitch may be formed after the pattern of the patterned mask layer 350 is transferred to the underlying single crystal stack layer 310. In detail, fin structures 310a, 310b are located respectively in area A and area B of the SOI substrate 300, wherein the fin structure 310a is consist of a first single crystal layer 311a and a second single crystal layer 315a, and the first single crystal layer 311a and the second single crystal layer 315a are separated by a separation region 313a. The fin structure 310b is consist of a first single crystal layer 311b and a second single crystal layer 315b, and the first single crystal layer 311b and the second single crystal layer 315b are separated by a separation region 313b as shown in FIG. 2.

Subsequently, an insulating layer 200 is formed between the fin structures 310a. For example, the process such as a chemical vapor deposition (CVD) process or a physical vapor deposition (PVD) may be performed to blanket deposit an insulating material layer (not shown) including the dielectric materials (ex. dielectric silicon oxide) on the SOI substrate 300 to fill the trenches. The second mask layer 333a, 333b remaining on the fin structure 310a, 310b may be used as an etch stop layer to perform a proper planarization process, such as a chemical mechanical planarization/polishing (CMP) process, to remove a portion of the insulating material layer and form the insulating layer 200 as shown in FIG. 2.

Figure 3:
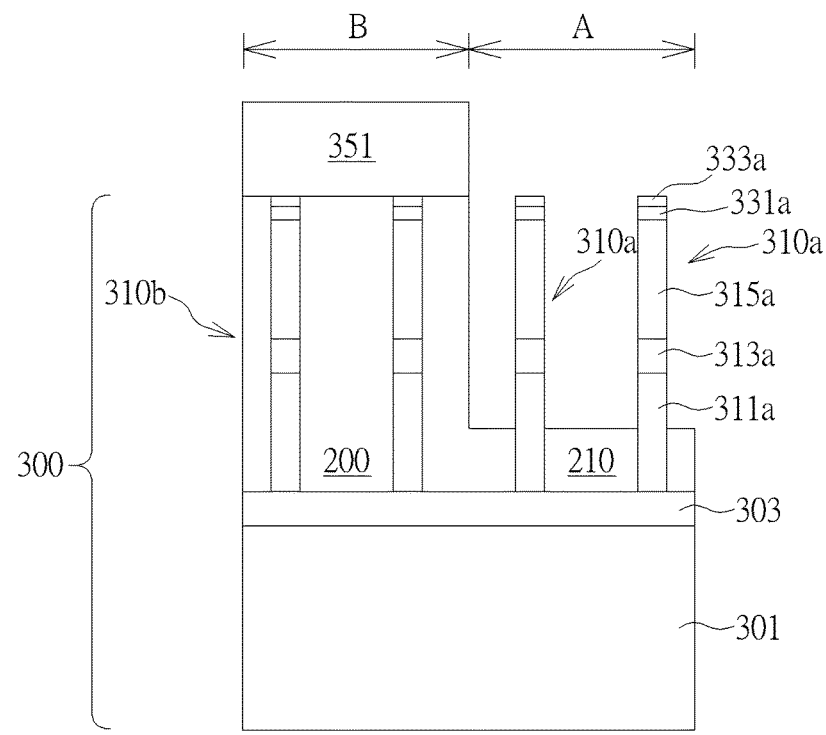

Later, a patterned mask layer is formed. For example, a patterned photoresist layer 351 with at least one opening covers on area B and exposes area A of the SOI substrate 300. Subsequently, a first etch process, such as a dry etch process, a wet etch process or a sequential dry etch and wet etch process, is performed to partially remove the insulating layer 200 in area A. That is, the etchant with higher etching rate to the insulating layer 200 may be used in the first etch process, and the second mask layer 333a and the first mask layer 331a remaining on the fin structure 310a and the patterned photoresist layer 351 are used as an etch mask to partially remove the insulating layer 200 in area A and form the insulating layer 210. The insulating layer 210 only partially covers the lower portion of the fin structure 310a. That is, the first single crystal layer 311a is partially covered to completely expose the second single crystal layer 315a and the separation region 313a on the upper portion of the fin structure 310a, as shown in FIG. 3.

Figure 4:
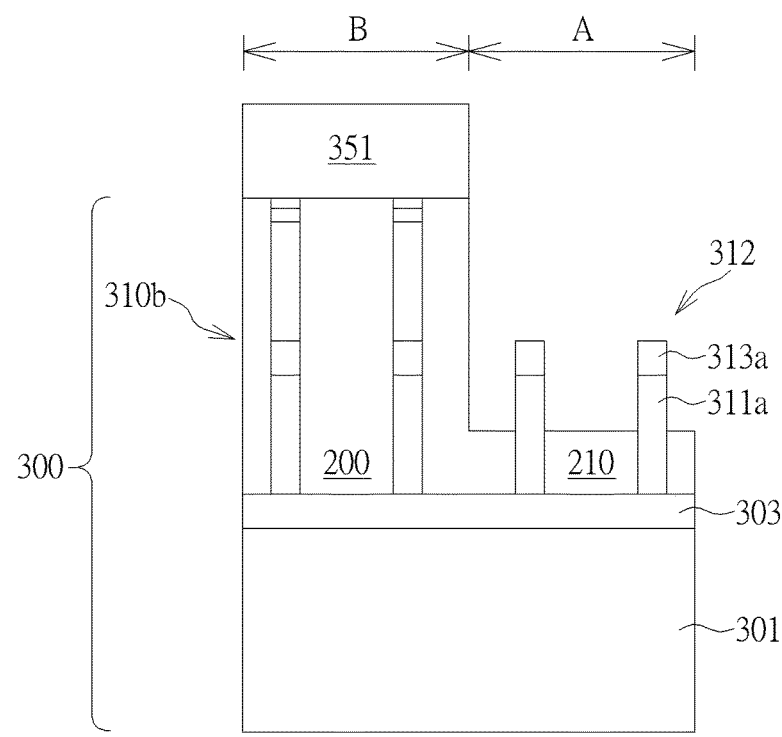

The patterned photoresist layer 351 is further used as an etch mask to perform a second etch process, such as a dry etch process, a wet etch process or a sequential dry etch and wet etch process. The etchant with higher etching rate to the second single crystal layer 315a may be used in the second etch process to complete remove the second mask layer 333a, the first mask layer 331a and the second single crystal layer 315a of the fin structure 310a that is exposed from the insulating layer 210 in area A. The patterned photoresist layer 351 is then completely removed, so that the fin structure 312 may be formed in area A of the SOI substrate 300 as shown in FIG. 4. Please note that only the lower portion of the fin structure 312 is covered by the insulating layer 210.

Figure 5:
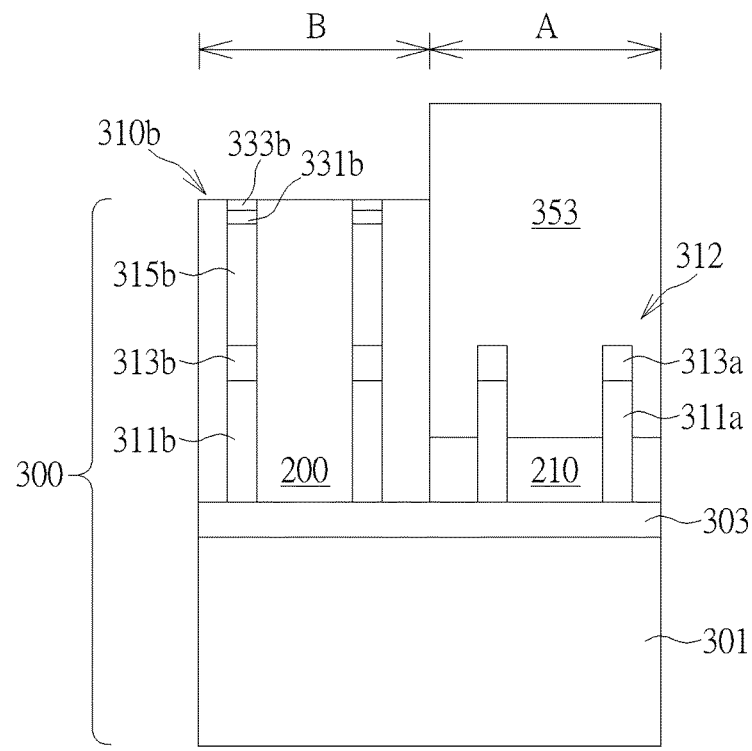
Figure 6:
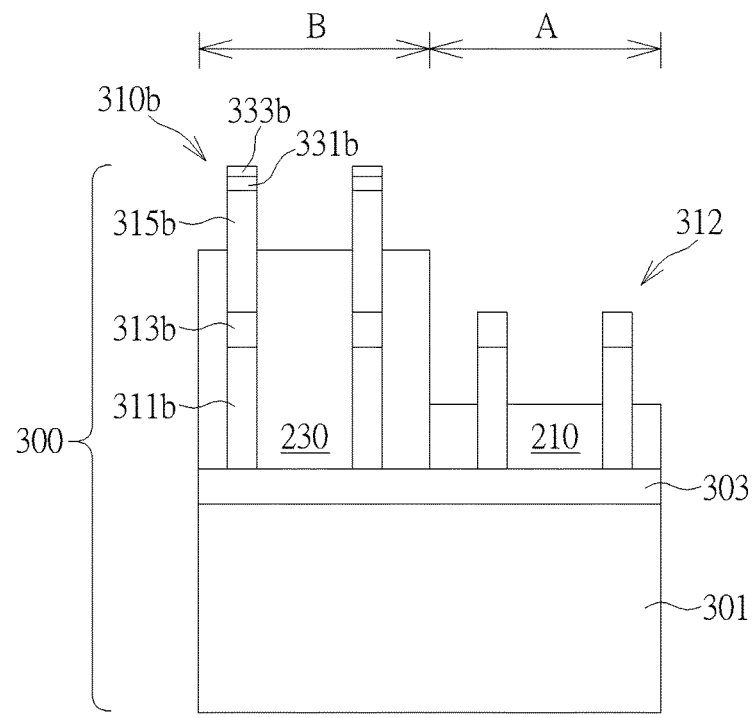

Subsequently, another patterned mask layer, such as a patterned photoresist layer 353 with at least one opening, is formed to cover area A and expose area B of the SOI substrate 300 as shown in FIG. 5. A third etch process, such as a dry etch process, a wet etch process or a sequential dry etch and wet etch process, is then performed to partially remove the insulating layer 200 in area B. Similar to the first etch process, the etchant with higher etching rate to the insulating layer 200 may be used in the third etch process and use the patterned photoresist layer 353 as an etch mask to form the insulating layer 230. The insulating layer 230 only partially covers the second single crystal layer 315b of the upper portion of the fin structure 310b and exposes a portion of the second single crystal layer 315b as shown in FIG. 6. Later, the patterned photoresist layer 353 is completely removed.

Figure 7:
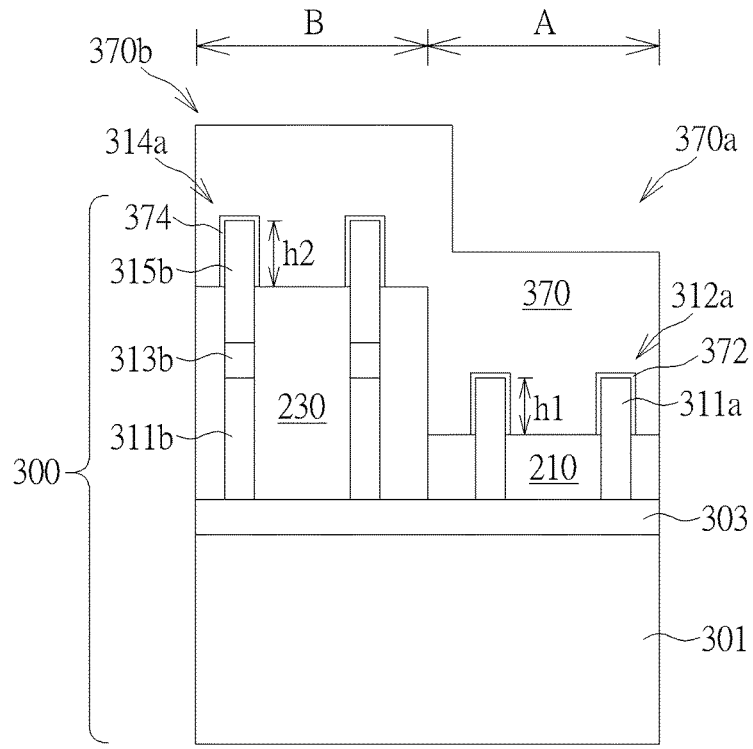

Subsequently, in order to form a tri-gate transistor device in following process, the second mask layer 333b and the first mask layer 331b remaining on the fin structure 310b and the separation region 313a on the fin structure 312 may be simultaneously removed to form the fin structure 312a and 314a respectively in area A and area B. Regular semiconductor process may be continuously performed to form gate dielectric layer 372, 374 respectively on the fin structure 312a and 314a and a gate electrode layer 370 traversing the fin structure 312a and 314a. In this way, the fin structure 312a, the gate dielectric layer 372 and the gate electrode layer 370 in area A and the fin structure 314a, the gate dielectric layer 374 and the gate electrode layer 370 in area B may constitute two tri-gate FinFETs 370a and 370b respectively, as shown in FIG. 7.

The manufacturing method in the present invention features the step of forming fin structures 312a, 314a with different heights and insulating layer 210, 230 with different thicknesses in area A and area B of the substrate 300, so that the insulating layer 210, 230 would cover only the lower portions of the fin structure 312a, 314a respectively and expose the upper portion of the fin structure 312a, 314a to form fins (not shown). In this embodiment, the fins in area A and area B preferably have the same height (i.e. h1=h2), but not limited thereto. Accordingly, the fin structures 312a, 314b with different heights may be used in the present invention to form FinFETs 370a, 370b at different levels, wherein the gate structure of the FinFET 370a traverses the upper portion of the fin structure 312a (ex. a portion of the first single crystal layer 311a), so that its channel region would be made of the first single crystal layer 311a (ex. epitaxial silicon). On the other hand, the gate structure of the FinFET 370b traverses the upper portion of the fin structure 314a (ex. a portion of the second single crystal layer 315b), so that its channel area would be made of the second single crystal layer 315b at higher level as shown in FIG. 7. Accordingly, the manufacturing method of the present invention may be applied to manufacture two or more FinFET devices, such as the FinFETs 370a, 370b with different conductive types in individual transistor areas depending on the device requirement to achieve a better device performance. In addition, the replacement metal gate (RMG) process may be optionally performed in later process to replace the gate electrodes 370 of the FinFETs 370a, 370b with metal gates, or only replace the gate electrode 370 of the FinFET 370b with a metal gate to make the FinFET device 370b as a high-voltage device with p-type/n-type conductivities.

The following description is directed to other FinFET embodiment of the present invention. To the sake of simplification, the following is primarily directed to describe the differences between the embodiments in details. No redundant description of identical components will be given. In addition, like reference numerals will be referred to like elements throughout the specification for the comparison of embodiments in the present invention.

Figure 8:
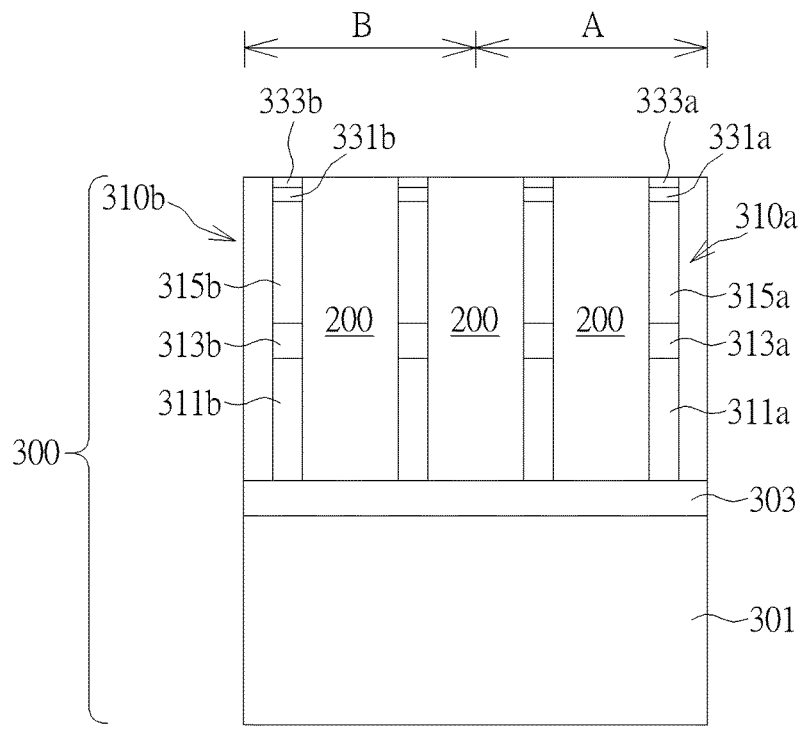
Figure 9:
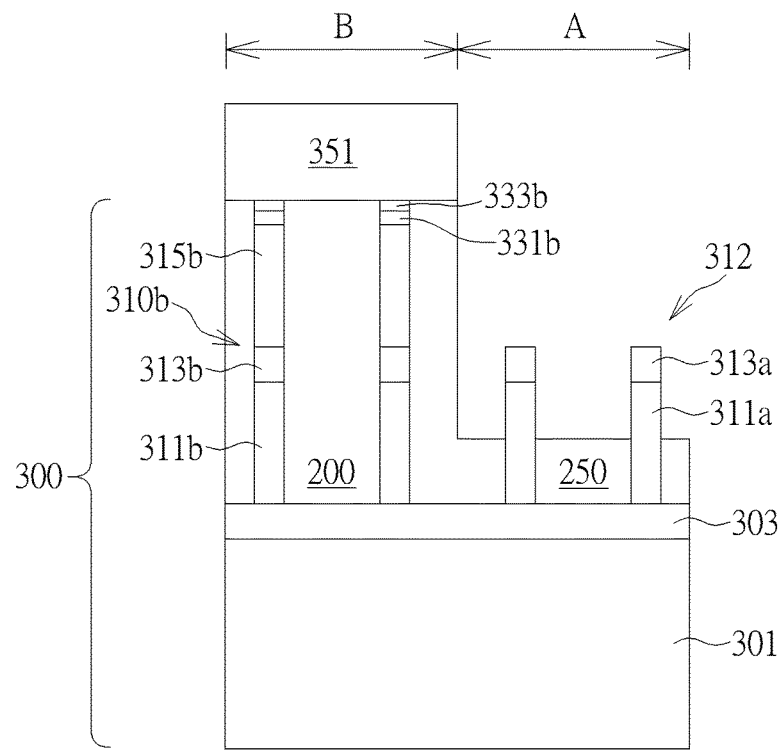
Figure 10:
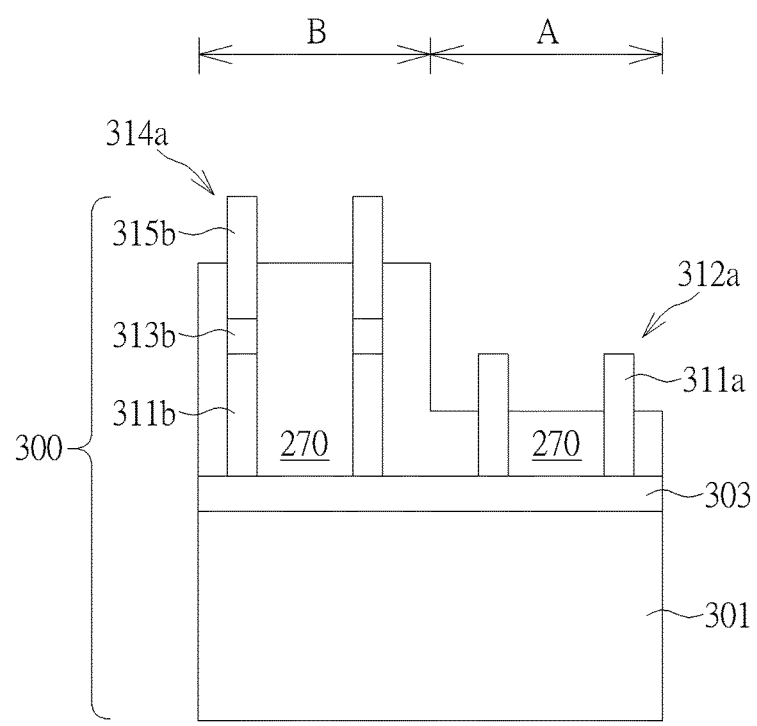

Please refer to FIGS. 8-10, which are schematic cross-sectional view illustrating the steps of forming the FinFET device according to the second preferred embodiment of the present invention. The process of FinFET device in this embodiment is generally similar to aforementioned first embodiment, which includes the steps of forming a plurality of fin structures 310a, 310b in two areas A, B of the SOI substrate 300 and an insulating layer 200. Redundant description of identical components is herein omitted.

The primary difference between this embodiment and previous embodiment is that an etch process, such as a dry etch process, a wet etch process or a sequential dry etch and wet etch process, will be performed after the patterned photoresist layer 351 is formed on the area B to partially remove the insulating layer 200 in the area A, and the second single crystal layer 315a of the fin structure 310a is completely remove to form fin structure 312 and insulating layer 250. The operation conditions and specific steps of the etch process is generally the same as the first etch process and second etch process shown in FIG. 3 and FIG. 4. Redundant description is omitted. Please note that, in this embodiment, the top surface of the insulating layer 250 and the top surface of the separation region 313a of the fin structure 312 are flush during the etch process, as shown in FIG. 9. That is, in this embodiment, the first single crystal layer 311a and the separation region 313a of the fin structure 312 are both covered by the insulating layer 250.

Later, the patterned photoresist layer 351 is completely removed. The second mask layer 333b and the first mask layer 331b remaining on the fin structure 310b and the separation region 313a of the fin structure 312 are used as an etch mask to perform another etch process, such as a dry etch process, a wet etch process or a sequential dry etch and wet etch process. The etchant with higher etching rate to the insulating layer 200 may be used in the etch process to partially remove the insulating layer 250 in area A and the insulating layer 200 in area B and forms the insulating layer 270. Later, in order to form a tri-gate transistor device, the remaining second mask layer 333b and the first mask layer 331b and the separation region 313a on the fin structure 312 may be simultaneously removed to form the fin structure 312a and 314a respectively in area A and area B, as shown in FIG. 10. Please note that the insulating layer 270 in area A and area B has different thicknesses and they would cover the lower portions of the fin structure 312a, 312b to expose the upper portions of the fin structure 312a, 312b respectively from the insulating layer 210, 230 and form fins (not shown). Subsequently, regular semiconductor process may be continuously performed to form the tri-gate FinFET devices, like the aforementioned first embodiment shown in FIG. 7.

Similarly, the manufacturing method of the present invention features the steps of forming fin structures 312a, 314a with different heights in different areas A, B to make the insulating layer 270 covering the lower portion of FinFETs 312a, 314a and expose the upper portion of FinFETs 312a, 314a respectively from the insulating layer 420. Accordingly, the present invention may use the FinFETs 312a, 314a with different heights to form FinFETs (not shown) at different levels.

Accordingly, the FinFET device of the present invention is provided with fin structures with different heights and the insulating layer with different thicknesses in different areas, so that the insulating layer would cover respectively the lower portions and exposes the upper portions of individual fin structures to form fins with the same height. In this way, the fin structures with different heights may be used to form FinFETs at different levels. Therefore, the channel regions of individual FinFETs may be disposed at different level and include different materials. The manufacturing method of the present invention may be applied to manufacture two or more FinFET structures with different conductive type in individual transistor areas to achieve a better device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin field effect transistor on a silicon-on-insulator substrate, comprising:
a first fin structure and a second fin structure on a substrate; and
an insulating layer covering said first fin structure and said second fin structure and exposing a first portion of said first fin structure and a second portion of said second fin structure;
wherein said first fin structure comprises a separation region under said first portion, and said first fin structure has a first height and said second fin structure has a second height, and said first height is not equal to said second height, and the top surface of said first fin structure and the top surface of said second fin structure are at different levels.

2. The fin field effect transistor on a silicon-on-insulator substrate of claim 1, wherein the length of said first portion of said first fin structure and the length of said second portion of said second fin structure are the same.

3. The fin field effect transistor on a silicon-on-insulator substrate of claim 1, wherein the materials of said first portion of said first fin structure and said second portion of said second fin structure are different.

4. The fin field effect transistor on a silicon-on-insulator substrate of claim 1, wherein said first fin structure comprises silicon-germanium, and the germanium concentration of said separation region is smaller than the germanium concentration of said first portion.

5. The fin field effect transistor on a silicon-on-insulator substrate of claim 1, wherein said first fin structure comprises a third portion under said separation region, and the materials of said third portion and said second portion of said second fin structure are the same.

6. The fin field effect transistor on a silicon-on-insulator substrate of claim 5, wherein said insulating layer covers said third portion and said separation region.

7. The fin field effect transistor on a silicon-on-insulator substrate of claim 1, wherein said substrate comprises a silicon-on-isolator substrate, and said first fin structure and said second fin structure are both disposed on a dielectric layer of said silicon-on-isolator substrate.

8. The fin field effect transistor on a silicon-on-insulator substrate of claim 1, further comprising:
a gate electrode layer on said substrate and traversing said first portion of said first fin structure and said second portion of said second fin structure; and
a first gate dielectric layer between said first portion of said first fin structure and said gate electrode layer, and said first fin structure, said first gate dielectric layer and said gate electrode layer constitute a first gate structure.

9. The fin field effect transistor on a silicon-on-insulator of claim 8, further comprising:
a second gate dielectric layer between said second portion of said second fin structure and said gate electrode layer, and said second fin structure, said second gate dielectric layer and said gate electrode layer constitute a second gate structure, wherein the channel region of said first gate structure is higher than the channel region of said second gate structure.

10. The fin field effect transistor on a silicon-on-insulator substrate of claim 1, wherein said first fin structure and said second fin structure are disposed respectively in a first area and a second area of said substrate, and the thickness of said insulating layer in said first area and said second area is different.

11. A method of forming a fin field effect transistor on a silicon-on-insulator substrate, comprising:
providing a substrate having a first area and a second area, wherein said substrate comprises a silicon-on-insulator substrate with a dielectric layer;
forming a stack structure on said dielectric layer, wherein said stack structure comprises a first single crystal layer and a second single crystal layer sequentially stacked on said dielectric layer;
forming a plurality of fin structures in said first area and said second area wherein said fin structures are disposed on said dielectric layer of said silicon-on-insulator substrate and comprise said first single crystal layer and said second single crystal layer;
forming an insulating layer covering said fin structures in said first area and said second area;
partially removing said insulating layer in said first area and forming a plurality of first fin structure with a first height;
partially removing said fin structures and said insulating layer in said second area and forming a plurality of second fin structures with a second height, wherein said first height and said second height are different, and the top surface of said first fin structure and the top surface of said second fin structure are at different levels.

12. The method of forming a fin field effect transistor on a silicon-on-insulator substrate of claim 11, wherein the forming steps of said stack structure comprises:
forming said first single crystal layer on said dielectric layer through a package process; and
forming said second single crystal layer on said first single crystal layer through a selective epitaxial growth process.

13. The method of forming a fin field effect transistor on a silicon-on-insulator substrate of claim 11, wherein the forming steps of said stack structure further comprises:
forming a separation region between said first single crystal layer and said second single crystal layer.

14. The method of forming a fin field effect transistor on a silicon-on-insulator substrate of claim 11, further comprising:
forming a gate electrode layer on said substrate, wherein said gate electrode layer traverses a first portion of said first fin structure and a second portion of said second fin structure; and
forming a gate dielectric layer between said gate electrode layer, said first fin structure and said second fin structure.

15. The method of forming a fin field effect transistor on a silicon-on-insulator substrate of claim 14, wherein the heights of said first portion of said first fin structure and said second portion of said second fin structure are the same.

16. The method of forming a fin field effect transistor on a silicon-on-insulator substrate of claim 11, wherein the thickness of said insulating layer in said first area and said second area is different after said first fin structure and said second fin structure are formed.

17. The method of forming a fin field effect transistor on a silicon-on-insulator substrate of claim 11, wherein said first height is larger than said second height.

\* \* \* \* \*